US012562733B2

(12) United States Patent
Srivongse

(10) Patent No.: US 12,562,733 B2
(45) Date of Patent: Feb. 24, 2026

(54) POWER MOSFET DRIVING CIRCUIT WITH TRANSFER CURVE GATE DRIVER AND GROUND SHIFT COMPENSATION

(71) Applicant: Curtis Instruments, Inc., Mount Kisco, NY (US)

(72) Inventor: Boripann Srivongse, Pleasanton, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 207 days.

(21) Appl. No.: 18/235,507

(22) Filed: Aug. 18, 2023

(65) Prior Publication Data

US 2024/0348248 A1     Oct. 17, 2024

Related U.S. Application Data

(60) Provisional application No. 63/458,799, filed on Apr. 12, 2023.

(51) Int. Cl.
H03K 17/687 (2006.01)
H03K 17/10 (2006.01)
H03K 17/16 (2006.01)

(52) U.S. Cl.
CPC ....... H03K 17/6871 (2013.01); H03K 17/102 (2013.01); H03K 17/162 (2013.01)

(58) Field of Classification Search
CPC ............. H03K 17/6871; H03K 17/102; H03K 17/162; H02M 7/5387; H02M 1/088; H02M 1/08; H02M 1/44; H02P 27/06
See application file for complete search history.

(56) References Cited

U.S. PATENT DOCUMENTS

| | | |
|---|---|---|
| 5,717,269 A | 2/1998 | Tang |
| 5,841,262 A | 11/1998 | Tang |

(Continued)

FOREIGN PATENT DOCUMENTS

| | | |
|---|---|---|
| EP | 0693826 A1 | 1/1996 |
| EP | 0717497 A2 | 6/1996 |

(Continued)

OTHER PUBLICATIONS

Ralph Mcarthur, Advanced Power Technology, "Making Use of Gate Charge Information in MOSFET and IGBT Data Sheets", Oct. 31, 2001, https://www.microsemi.com/document-portal/doc_view/14697-making-use-of-gate-charge-information-in-mosfet-and-igbt-data-sheets, 8 pages.

*Primary Examiner* — Metasebia T Retebo
(74) *Attorney, Agent, or Firm* — The Belles Group, P.C.

(57)     ABSTRACT

A waveshape circuit for a motor includes at least a first transistor, a second transistor, a first subcircuit, and a second subcircuit. The first transistor is configured to, during turn on, substantially pass a current through the waveshape circuit and block the current, during turn off, for a transition of a power circuit of the motor. The second transistor is configured to, during turn on, substantially block the current through the waveshape circuit and substantially pass current, during turn off, for the transition for the power circuit of the motor according to a transfer function. The first subcircuit is coupled to the first transistor and configured to determine a first slope region of the transfer function for the waveshape circuit. The second subcircuit is coupled to the first transistor and configured to determine a second slope region of the transfer function for the waveshape circuit.

20 Claims, 10 Drawing Sheets

(56) References Cited

U.S. PATENT DOCUMENTS

| | | | |
|---|---|---|---|
| 5,889,347 | A | 3/1999 | Tang et al. |
| 6,442,535 | B1 | 8/2002 | Yifan |
| 7,285,876 | B1 | 10/2007 | Jacobson |
| 7,408,398 | B2 | 8/2008 | Sander |
| 7,511,540 | B2 | 3/2009 | Dickman et al. |
| 7,551,004 | B2 | 6/2009 | Okazaki et al. |
| 7,602,228 | B2 | 10/2009 | Mazzola et al. |
| 7,741,750 | B1 | 6/2010 | Tang |
| 7,812,647 | B2 | 10/2010 | Williams |
| 7,940,092 | B2 | 5/2011 | Zheng et al. |
| 8,018,113 | B2 | 9/2011 | Tang |
| 8,122,590 | B2 | 2/2012 | Tang et al. |
| 8,493,018 | B2 | 7/2013 | Kroeze et al. |
| 8,664,907 | B2 | 3/2014 | Kroeze et al. |
| 8,896,142 | B2 | 11/2014 | Arlaban Gabeiras et al. |
| 9,182,293 | B2 | 11/2015 | Tang |
| 9,344,006 | B2 | 5/2016 | Kimmer |
| 9,350,341 | B2 | 5/2016 | Lee et al. |
| 9,543,821 | B2 | 1/2017 | Odell et al. |
| 9,787,212 | B2 | 10/2017 | Baumann et al. |
| 2006/0186854 | A1 | 8/2006 | Ho et al. |
| 2009/0009122 | A1* | 1/2009 | Yoshitomi ............ H02P 7/2913 |
| | | | 318/504 |
| 2009/0153083 | A1 | 6/2009 | Rozman et al. |
| 2010/0133023 | A1 | 6/2010 | Tang |
| 2010/0141080 | A1 | 6/2010 | Tang |
| 2010/0244612 | A1 | 9/2010 | Tang |
| 2011/0197431 | A1 | 8/2011 | Tang et al. |
| 2012/0194119 | A1 | 8/2012 | Kroeze et al. |
| 2014/0209344 | A1 | 7/2014 | Kalayjian et al. |
| 2014/0253023 | A1 | 9/2014 | Paryani et al. |
| 2014/0257613 | A1 | 9/2014 | Tang |
| 2014/0269831 | A1 | 9/2014 | Tang |
| 2015/0028785 | A1 | 1/2015 | Tang |
| 2015/0032423 | A1 | 1/2015 | Tang |
| 2018/0138902 | A1* | 5/2018 | Lu .......................... H03K 17/14 |

FOREIGN PATENT DOCUMENTS

| | | |
|---|---|---|
| EP | 0910887 A1 | 4/1999 |
| EP | 1104091 A1 | 5/2001 |
| EP | 2237392 A3 | 7/2012 |
| EP | 2177390 A3 | 5/2013 |
| EP | 2388894 A3 | 8/2013 |
| EP | 2388895 A3 | 8/2013 |
| EP | 2202871 A3 | 4/2014 |
| JP | 7034330 B2 | 3/2022 |
| WO | 2012006605 A2 | 1/2012 |
| WO | 2012006605 A3 | 4/2012 |
| WO | 2015013303 A3 | 3/2015 |
| WO | 2021198471 A1 | 10/2021 |

* cited by examiner

1

RC WITH DIODE TURNING ON GATE DRIVER

—LABEL CH1 GATE TO        —LABEL CH2 DRAIN TO
SOURCE VOLTAGE                 SOURCE VOLTAGE

4

RC WITH DIODE TURNING OFF GATE DRIVER

—LABEL CH1 GATE TO        —LABEL CH2 DRAIN TO
SOURCE VOLTAGE                 SOURCE VOLTAGE

POWER MOSFET DRIVING CIRCUIT WITH TRANSFER CURVE GATE DRIVER AND GROUND SHIFT COMPENSATION

This application claims priority benefit of U.S. Provisional Application No. 63/458,799 filed Apr. 12, 2023, which is hereby incorporated by reference in its entirety.

FIELD

The present application relates to a driving circuit for a motor or multiple driving circuits for different phases of the motor.

BACKGROUND

A power amplifier including an inverter may be used to power an alternating current (AC) three phase motor. The power amplifier may be controlled by a low-power input and produce a high-current drive input for one or more gate inputs of high power elements or semiconductors including field effect transistors (FETs), metal-oxide semiconductor field effect transistors (MOSFETs), bipolar junction transistor (BJTs), insulated-gate bipolar transistors (IGBTs), silicon carbide (SiC) or another type of semiconductor switch.

One problem experienced by conventional topologies is the inverter may experience ground movement between the phases of the motor. The ground movement between motor phases and logic ground present a challenge in the link between the logic board for controls and the power board for the power supply.

Another problem experienced by conventional topologies is ringing or oscillations in the output. When the power amplifier includes or is otherwise driven by standard gate driver circuits including a resistor capacitor (RC) filter/subcircuit, ringing is present at the output of the high power elements.

BRIEF DESCRIPTION OF THE DRAWINGS

Exemplary embodiments are described herein with reference to the following drawings, according to an exemplary embodiment.

FIG. 1A illustrates example waveforms for a driving circuit for a power MOSFET with an RC filter during turn on.

FIG. 2A illustrates example waveforms for a driving circuit for a motor with a power MOSFET with p-channel field effect transistors (PFETs) during turn on.

DETAILED DESCRIPTION

Parasitic oscillations may occur when paralleling two or more power metal-oxide-semiconductor field-effect transistors (MOSFETs). This oscillation can impact product reliability, cause higher electromagnetic interference (EMI), and increase switching losses when the power MOSFETs are driving a motor. Other topologies address this problem by slowing down the entire switching waveform just to achieve the initial turn-on of the motor drive power MOSFET. By doing so, it increases the overall switching losses, causing a higher power dissipation and increasing the junction temperature of the MOSFET, which leads to more conduction losses. As a result, a higher number of power devices are required to achieve the desired output power, which means a larger product footprint and a higher cost.

Another challenge in switching speed adjustment is the turn off speed for the power MOSFETs. When the turn on is slowed down, the turn off will automatically be slower as well. The driving circuits in the following embodiments eliminate this challenge by making the turn on and turn off independent of each other.

Another consideration in slowing down switching speed in order to reduce high EMI and the possibility of parasitic oscillation between each power MOSFET is that oscillations and losses may be caused for another reason. An RC delay may also be present. When the nature of the RC curve is opposite from what power MOSFET needs for the speed up during initial turn on and slow down after the Miller point or during the peak drain current, the RC curve may cause the oscillation and increase switching loss.

Some other applications use ferrite beads to suppress the excessive energy at the gate in order to stop the oscillation. This technique depends on the resonance frequency that the ferrite bead can absorb, and most likely not as effective due to many other variations.

Another topology is to increase gate capacitance to reduce the turn on speed and stop the gate oscillation. This technique creates a long gate voltage plateau, which causes the power MOSFET to run in linear mode longer than expected, causing high switching losses. Running the power MOSFET in linear mode for a long time can also cause product reliability issues as well, which depends on which the transconductance of power MOSFETs that could create hot spots.

Another method is to slow down the turn on and speedup turn off by using a diode, but this can cause high voltage spikes due to the stepping between in and out of Miller region. This will require manufacturers to use higher voltage rating power MOSFETS that usually has higher drain to source resistance (Rds-on). This technique only reduces the switching losses during turn off. The following embodiments solves the gate oscillation, high EMI, switching loss and conduction loss issues.

Figure 1A:
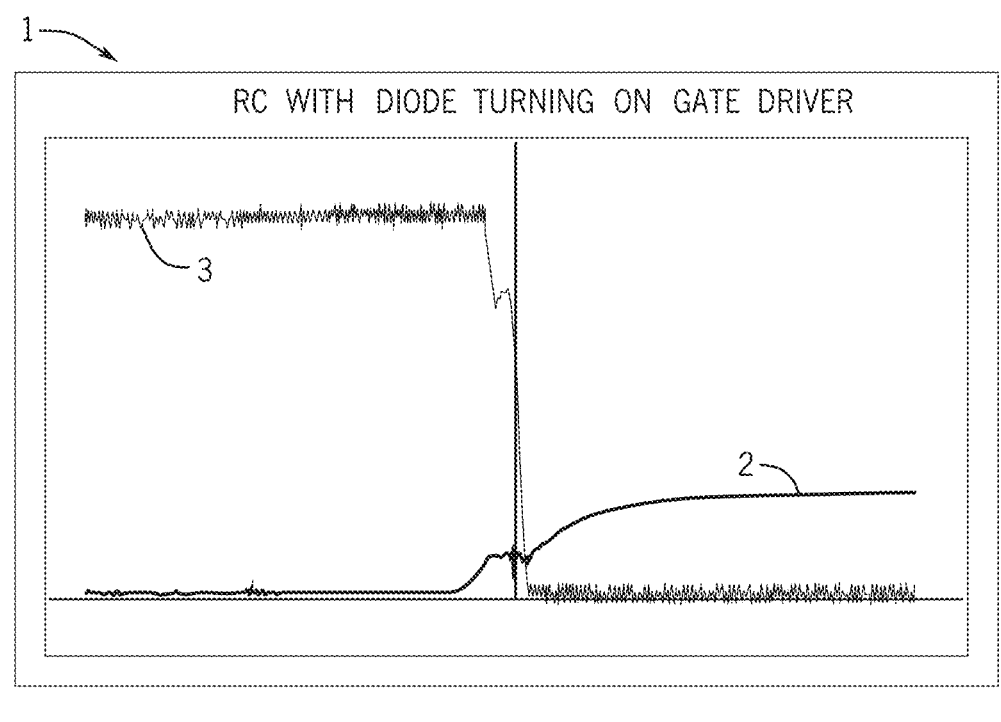
Figure 1B:
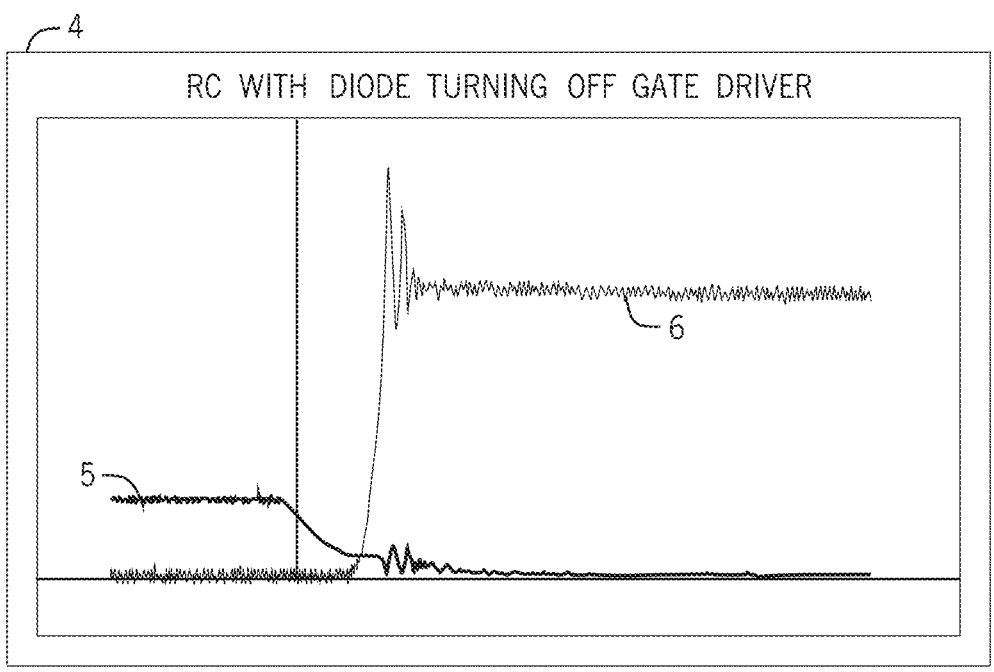
FIG. 1B illustrates example waveforms for a driving circuit for a power MOSFET with an RC filter during turn off.

FIG. 1A illustrates example waveforms for a driving circuit for a power MOSFET with an RC filter during turn on. FIG. 1B illustrates example waveforms for a driving circuit for a power MOSFET with an RC filter during turn off.

FIG. 1A illustrates an example chart 1 for opposing power MOSFETs driven by a gate drive circuit having a RC filter/subcircuit for slow turn on. The chart 1 includes a waveform at the gate 2 (RC curve) during turn on. Waveform 2 corresponds to gate voltage and waveform 3 corresponds to drain voltage turning on.

FIG. 1B illustrates an example chart 4 for opposing power MOSFETs driven by a gate drive circuit having an RC filter/subcircuit for turn off. The chart 4 includes a waveform 5 at the gate voltage Vgs (RC curve) during turn off. The chart 4 includes a waveform 6 for the drain voltage turning off.

Figure 2A:
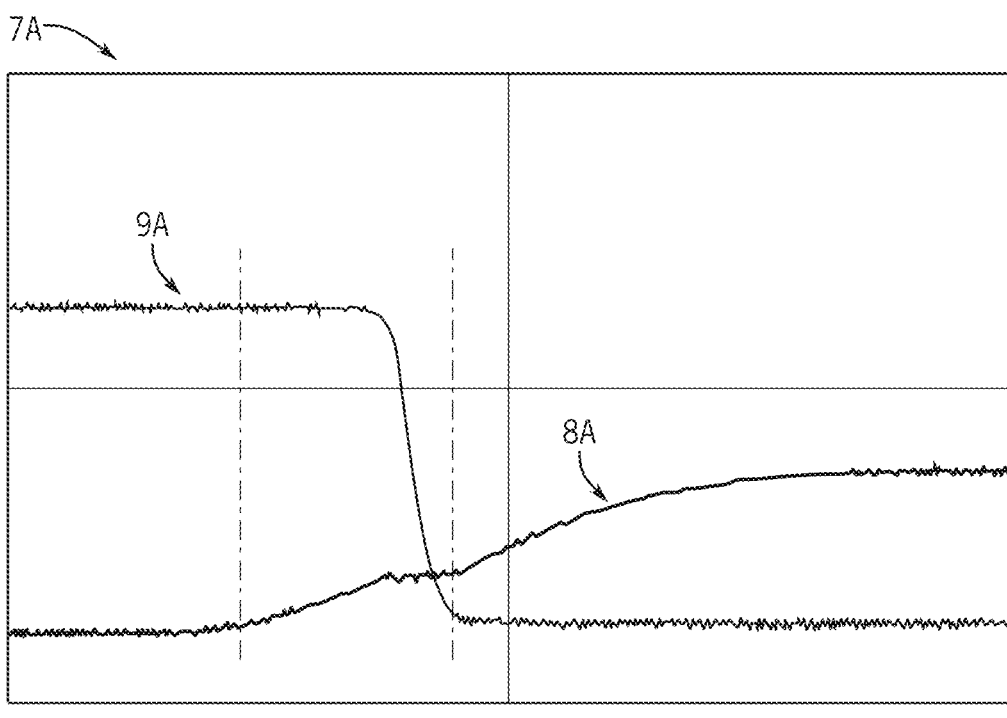
Figure 2B:
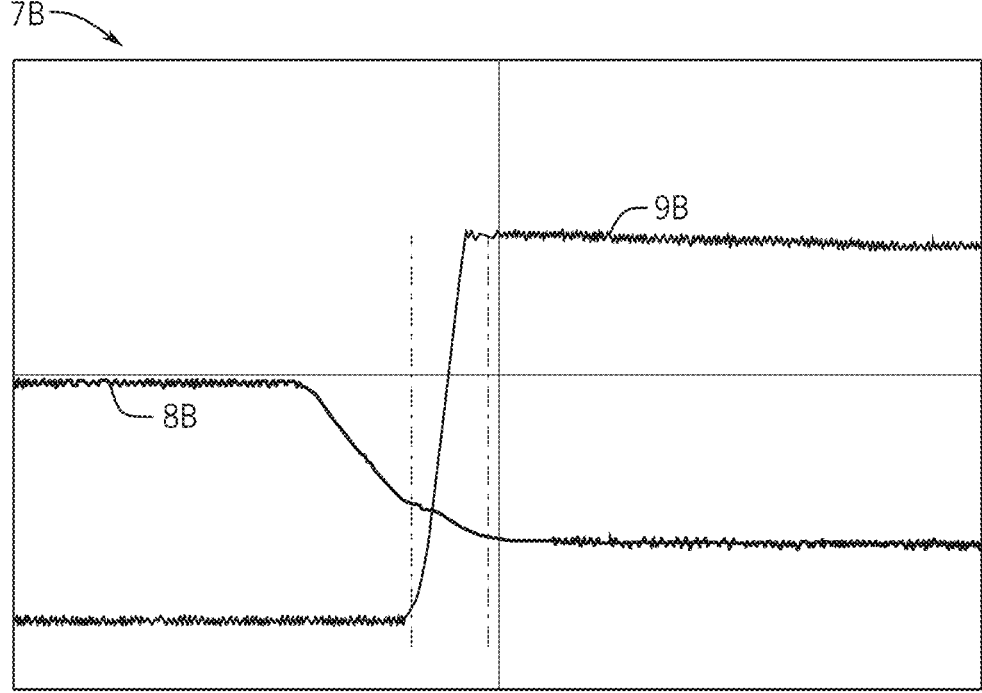
FIG. 2B illustrates example waveforms for a driving circuit for a motor with power MOSFETs with PFETs during turn off.

In contrast, FIGS. 2A and 2B illustrate example waveforms for a driving circuit for a motor with a power MOSFET with p-channel field effect transistors (PFETs) during turn on and turn off.

FIG. 2A illustrates an example chart 7A for a gate driver according to the following embodiments. The chart 7A includes waveform 8A corresponds to a first gate driver (turning on in FIG. 2A), and waveform 9A corresponds to a drain of a power MOSFET (turning on in FIG. 2A). Both a quick turn on in waveform 8A and a quick turn on in waveform 9A are achieved. FIG. 2B illustrates an example chart 7B including a waveform 8B corresponding to the first gate driver (turning off in FIG. 2B), and a waveform 9B corresponds to the drain voltage.

Figure 3:
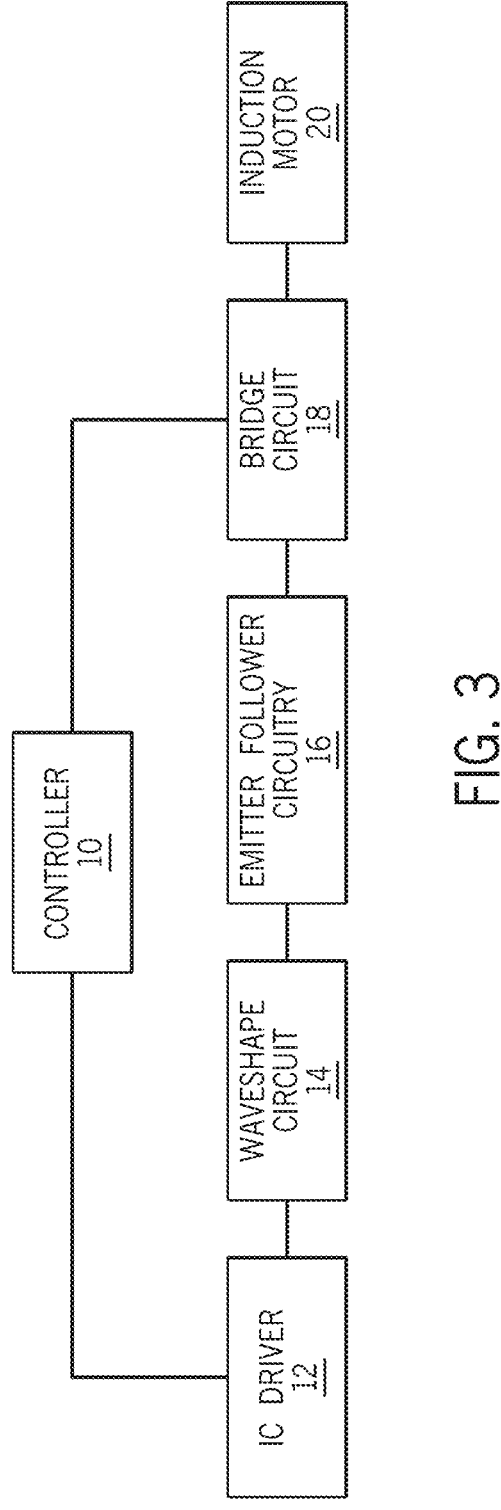
FIG. 3 illustrates an example block diagram for a system for driving a motor.

FIG. 3 illustrates an example system for providing power to a motor. The system includes a controller 10 (microcontroller), an integrated circuit driver 12, a waveshape circuit 14, an emitter follower circuit 16, a bridge circuit 18, and an induction motor 20. Additional, different, or fewer components may be included.

The controller 10 may generate and send instructions to one or more other devices including the IC driver 12 and the bridge circuit 18. The controller 10 may receive instructions from another system (e.g., engine control unit of a vehicle) to set a speed and/or direction of the induction motor 20. The controller 10 may receive commands from a user input to set a speed and/or direction of the induction motor 20.

The IC driver 12 receives an input from the controller 10. The IC driver 12 is provided with multiple supply voltages (e.g., logic supply voltage and floating supply voltage) and outputs multiple output signals (e.g., high voltage supply and low side driver output).

The high voltage supply of the IC driver 12 turns on the waveshape circuit 14. The waveshape circuit 14 includes one or more MOSFETs (referred to a driver MOSFETs) to drive the power MOSFETs of the bridge circuit 18 that run the induction motor 20. The driver MOSFETs of the waveshape circuit 14 exhibit the same or similar characteristics to the power MOSFETs of the bridge circuit 18 to control the switching speed. In other words, the characteristics of the power MOSFETs are matched by the driving MOSFETs to eliminate one or more of the aforementioned drawbacks. The smooth transition in and out of Miller region allows for a fast turn-on along with a reduction of gate oscillation as well as a fast turn off to reduce high voltage spikes. This technique is also temperature compensated by P-FETs, whereas many others prior approaches are not. In one example, the power circuit 18 includes three half-bridges inverters at each of the three half-bridge inverters includes the power MOSFETS.

Optionally, between the waveshape circuit 14 and the bridge circuit 18, an emitter follower circuit 16 is connected. The emitter follower circuit 16 is an amplifier (e.g., common collector amplifier) that may include one or more bipolar junction transistors (BJTs) that may be used as a voltage buffer. The emitter follower circuit 16 coupled to the power circuit 18 of the motor 20 amplifies an output of the waveshape circuit 14.

The bridge circuit 18 may include any example hard switched converter using a voltage or current input. The bridge circuit 18 may include any number of half bridges (e.g., three half bridge circuits to generate the three phases for the induction motor 20).

The induction motor 20 includes windings in three phases that cause a rotor to rotate under a force of a magnetic field induced from current flowing through the windings. The windings receive the output from the bridge circuit 18. First phase windings receive power from a first half bridge of the bridge circuit 18, second phase windings receive power from a second half bridge of the bridge circuit 18, and third phase windings receive power from a third half bridge of the bridge circuit 18.

Figure 4:
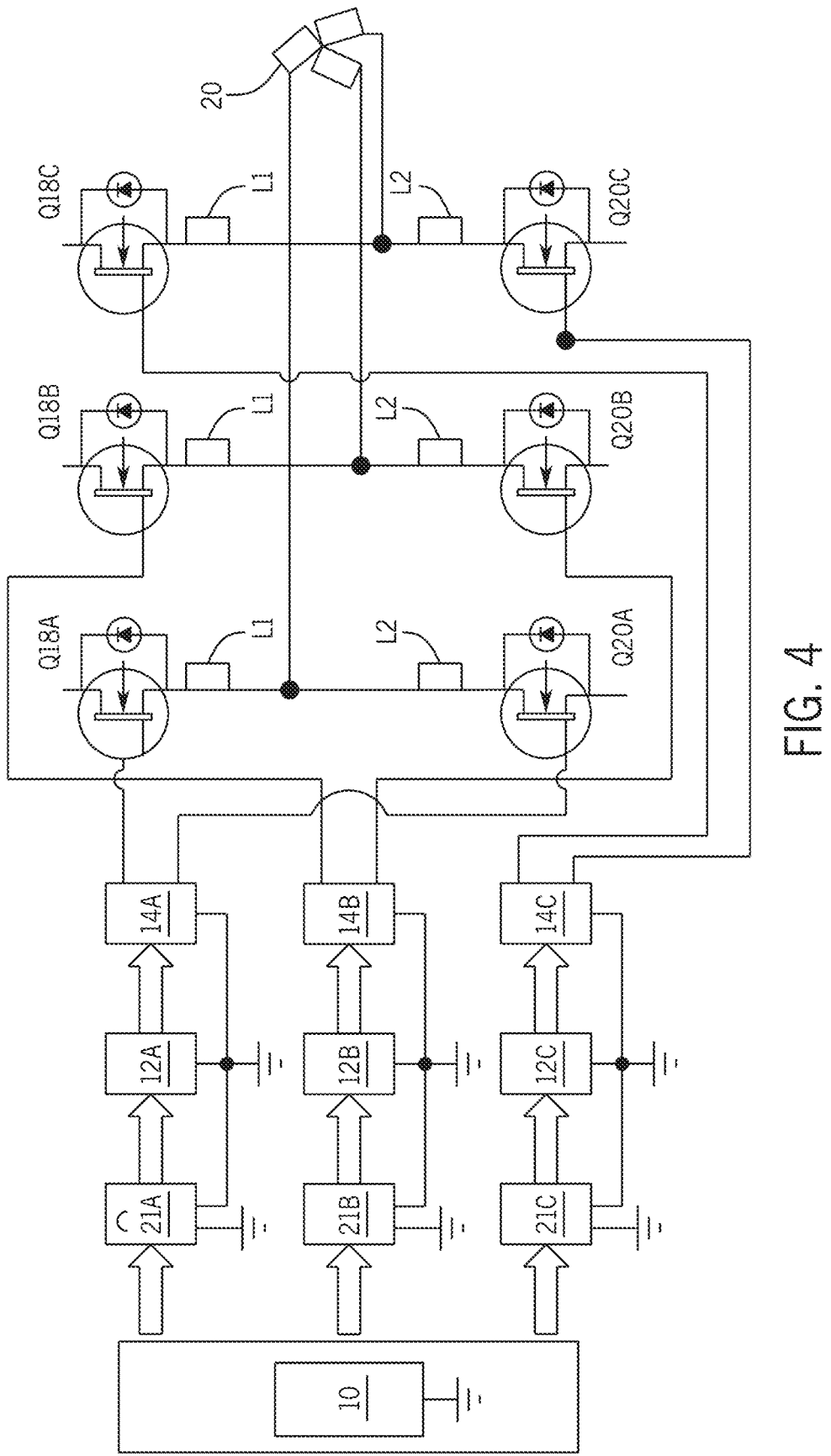
FIG. 4 illustrates another example system for driving the motor.

FIG. 4 illustrates another example system for powering the induction motor 20. In the example of FIG. 4, the microcontroller 10 provides instructions to a separate IC driver 12 and waveshape circuit 14. In addition, each phase may include a ground compensation circuit 21. Each phase, or separate IC driver 12 and waveshape circuit 14, is connected to a pair of MOSFETs in the power bridge. For example, a first IC driver 12A and waveshape circuit 14A is electrically coupled to the pair of MOSFETs Q18A and Q20A, a second IC driver 12B and waveshape circuit 14B is electrically coupled to the pair of MOSFETs Q18B and Q20B, and a third IC driver 12C and waveshape circuit 14C is electrically coupled to the pair of MOSFETs Q18C and Q20C. Each pair of MOSFETs may be connected together by one or more inductors. Transistors Q18A-C may be connected to a power rail via inductors. An inductor connects MOSFETs Q18A and Q20A with MOSFETs Q18B and Q20B, and another inductor connects MOSFETs Q18B and Q20B with MOSFETs Q18C and Q20C (not shown). The power rail may also include an LC circuit (not shown). Each pair of MOSFETs may also include a first inductor L1 and a second inductor L2 connected to the phases of the AC motor 20.

Figure 5:
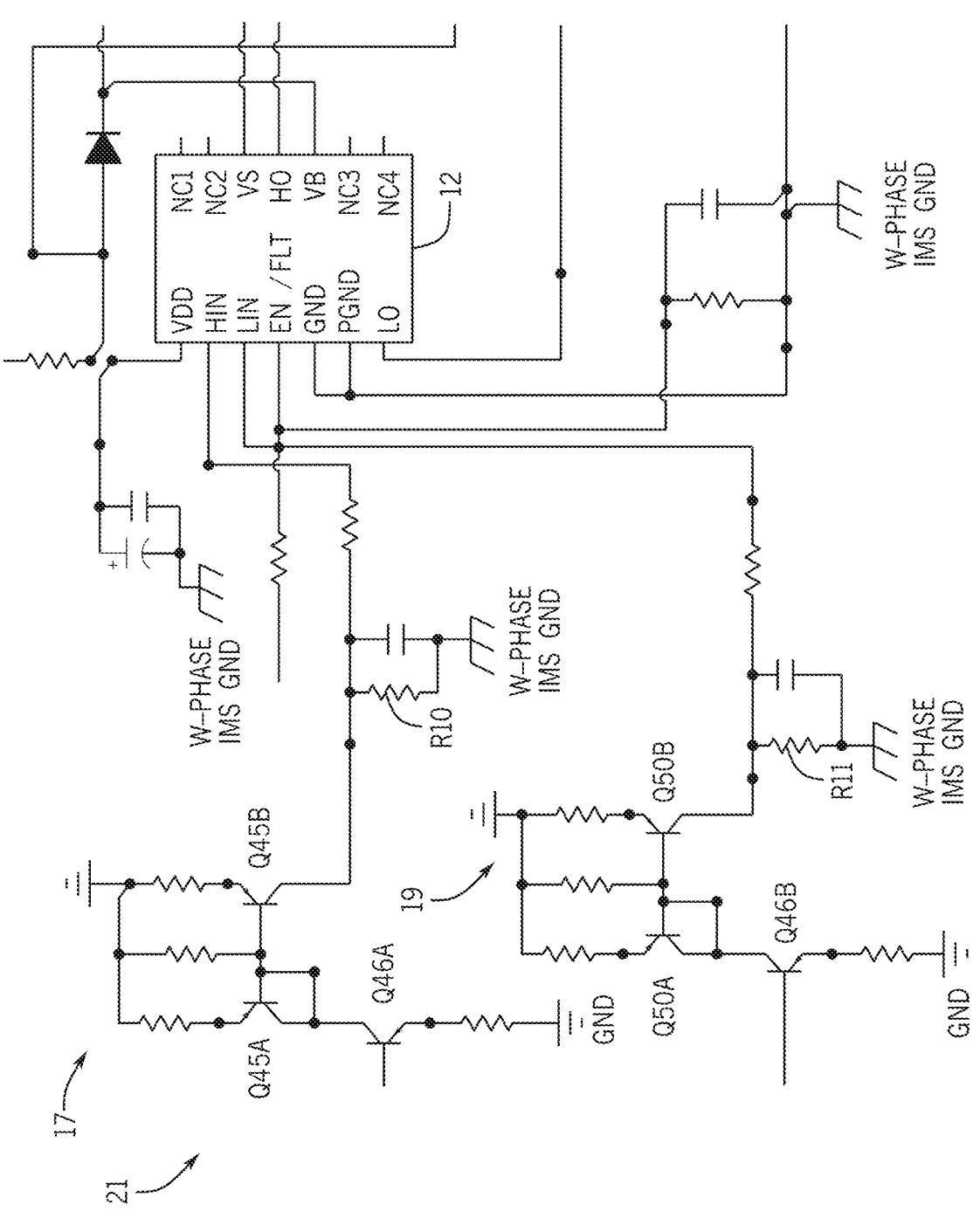
FIG. 5 illustrates an example ground compensation circuit.

FIG. 5 illustrates additional details of the ground compensation circuit 21 for one of the phases in FIG. 4. The ground compensation circuit 21 includes the gate driver 12, first amplifier 17 and second amplifier 19, and a ground shift compensator element. The gate driver 12 may include a high input (HIN) connection or pin, a low input (LIN) connection or pin and an enable input (EN) connection or pin. The high input (HIN) may be connected to the first amplifier 17 which may include two or more active devices (e.g., transistors Q45A and Q45B, and, optionally, Q46A). The low input (LIN) may be connected to the second amplifier 19 which may include two or more active devices (e.g., transistors Q50A and Q50B). The enable input (EN) may be connected to microcontroller 10, which provides the enable signal to turn on the IC driver 12.

When operating the bridge circuit 18 (e.g., because of fast switching) the ground of the respective phases may shift according to the current. This ground shift cause the IC driver 12 to have errors. For example, a loss of communications between the microcontroller 10 and the IC driver 12 because of a shift in voltages causes disruption of the timing sequences between the section of the circuit for turning off and the section of the circuit for turning on. The ground shift compensator is configured to bring the grounds of the respective phases within a predetermined potential of IC driver. Bringing the ground of driver IC 12 to the same ground level of motor drive power MOSFET ground addresses this communication problem. The wave shaper P-FETs resistors operate a voltage divider to force agreement between the ground reference with the motor driver FETs ground.

The ground shift compensator may be a circuit element such as resistor R10 and/or resistor R11. The resistor R10 is connected between the high input (HIN) and the phase ground (W-phase IMS GND or GND). The resistor R11 is connected between the low input (LIN) and the phase ground (W-phase IMS GND or GND). The resistors R10 and R11 have constant voltages across the circuit elements and constant current through the circuit elements. This acts to compensate for ground shifting because resistor R10 and R11 ground moves along with the motor phase ground.

Thus, the ground shift compensator is electrically connected to either the high input (HIN) connection or the low input (LIN) connection. Two ground shift compensators may be used (e.g., the resistor R10 is a first ground shift compensator electrically connected to the high input (HIN) connection and the second resistor R11 is a second ground shift compensator electrically connected to the low input connection.

Figure 6:
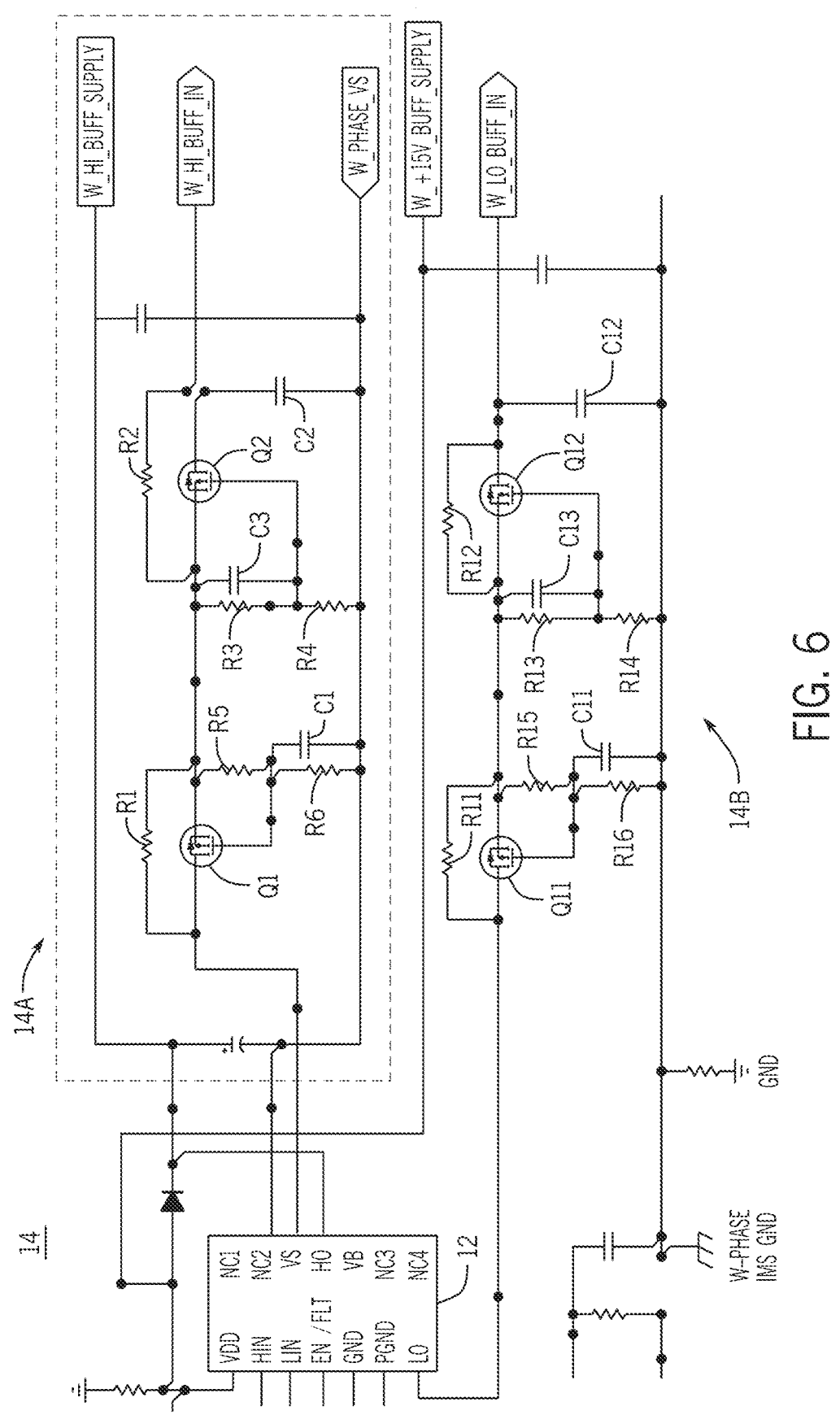
FIG. 6 illustrates an example driving circuit.

FIG. 6 illustrates waveshape circuit 14. The waveshape circuit 14 is connected to the IC driver 12. The waveshape circuit 14 includes two opposing sides: a first waveshape circuit 14A corresponds to the W phase VS portion of the bridge circuit 18 and a second waveshape circuit 14B corresponds to the W phase GND portion of the bridge circuit 18. Each of the first waveshape circuit 14A and the second waveshape circuit 14B includes two pairs of transistors (e.g., p-channel MOSFETs or P-FETs) arranged in opposite directions for turning on and turning off of motor drive power MOSFETs. The transistors may be referenced as first transistor Q1 and second transistor Q2 for the W Phase VS. The first transistor Q1 and the second transistor Q2 may be P-type MOSFETs. The second pair of transistors may be referenced as first transistor Q11 and second transistor Q12 for the W Phase GND. The following description is described with respect to first transistor Q1 and second transistor Q2 but is also applicable to first transistor Q11 and second transistor Q12.

The waveshape circuit 14 drives the power bridge 18. With respect to the transistors of the power bridge 18, the transistors Q1 and Q2, having different duties: Q1 controls turning off of power bridge 18, Q2 controls turning on of power bridge 18. The transistors are on/off at the same time Q1 controls turn off edges, Q2 controls turn on edges. In addition, because the first transistor Q1 and the second transistor Q2 are sourcing the current differently according to Q1 and Q2 transfer curve. Therefore, dv/dt of the gate voltage of power bridge 18 will varies accordingly to the rate of change of transfer curve of Q1 and Q2 current sourcing. Since this gate voltage of bridge 18 Power MOSFETS generated by the transfer curve of Q1 and Q2, therefore it will compensate the timing sequence with power MOSFET of bridge 18 temperature.

When the IC driver 12 initially is switched high, Q2 will be in the non-ohmic sourcing current accordingly to Q2 transfer curve state as the gate voltage of Q2 gets lower (−Vgs), Q2 entering ohmic state allows higher current to pass through accordingly to Rds on of Q2. At the same time the voltage at the gate of power MOSFETs of bridge circuit 18 approaches the gate plateau voltage, the current that causes the gate voltage of the power MOSFETs of bridge circuit 18 to rise increases to maintain the rate of change (dv/dt). Q2 would adjust the current that can pass through Q2 as defined by the transfer curve of Q2. Therefore, the waveshape circuit 14 is configured to constantly adjust the output current to keep up with the current demand of the power MOSFETs of bridge circuit 18, resulting in reduction of the gate voltage plateau of the power MOSFETs of bridge circuit 18. A shorter plateau means less time for power MOSFETs of bridge circuit 18 running linear and allows better current sharing when paralleling a lot of power MOSFETs for an application with high current requirements. Product reliability is improved. For high transconductance power MOSFETs, the risk of hot spots in the device are also reduced.

Figure 7:
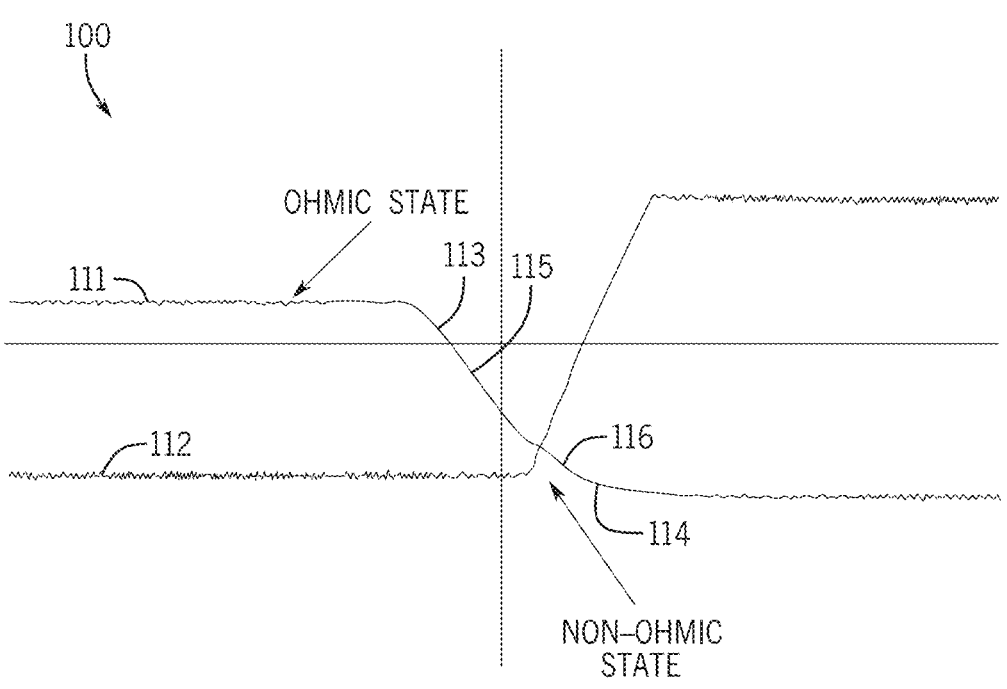
FIG. 7 illustrates example transistor voltages for the driving circuit.

The waveshape circuit 14 also includes a first subcircuit associated with the first transistor Q1 and a second transistor associated with the second transistor Q2. FIG. 7 illustrates a chart 100 for an example operation of the waveshape circuit 14 as measured at the emitter follower circuit 16. The chart 100 includes plot 111 for the gate voltage and plot 112 for the drain voltage. The plot 111 illustrates the ohmic state 113 of bridge 18 and the non-ohmic state 114 of bridge 18. The second slope 116 represents the non-ohmic state. That is the plot 111 for the gate voltage includes a first rate of change of the gate voltage for a first time period and a second rate of change of the gate voltage for a second time period. A slope of the first slope region is greater than a slope of the second slope region.

During turn on operation transistor Q2 is configured to substantially momentarily block a current through the waveshape circuit 14 during a transition for the power bridge 18 of the induction motor 20. The first transistor Q1 during turn off initially configured to substantially pass the current through the waveshape circuit 14 during the transition for the power bridge 18 of the induction motor 20 according to a transfer function.

The first subcircuit electrically connected to the first transistor Q1 is configured to determine turn off a first slope region of the transfer function for the waveshape circuit 14. The second slope transition from first slope to a second slope region of the transfer function with the transfer curve function of Q1 for the waveshape circuit 14.

The first subcircuit includes each, all, or any combination of elements including R1, R5, R6, and C1 reference to AC motor phase. Various elements have values (e.g., resistance, capacitance) that may be selected to input the output of the waveshape circuit 14 during the turning on sequence. Resistors R5 and R6 define a voltage divider for transistor Q1 so that when transistor Q2 moves from the ohmic state to the non-ohmic state, the voltage divider is configured to determine or dictate when the non-ohmic state starts in time. The values for resistor R5, resistor R6 and capacitor determine the first slope region. C1 determines or causes the length of time that Q1 is in the ohmic state. Resistor R1 defines the second slope 116 for the transistor Q1.

The second subcircuit includes each, all, or any combination of elements including R2, R3, R4, C2, and C3 reference to AC motor phase. Various elements have values (e.g., resistance, capacitance) that may be selected to input the output of the waveshape circuit 14 during the turning on sequence. Resistors R3 and R4 define a voltage divider that is configured to set how far the gate voltage of transistor Q2 can fluctuate in order to pass the non-ohmic state. C2 acts as a load for a current source to generate the wave shape. R2 causes the output of the gate driver to float when both transistors Q1 and Q2 are off. Resistor R2 defines the second slope 116 for the transistor Q2.

During the turn off sequence of transistor Q1, starting from ohmic state according to the transfer-curve. Then Q1 enters the non-ohmic state at the highest current in non-ohmic state according to the transfer curve. At this time the MOSFETs of the power bridge 18 gate will enter the gate threshold voltage that will generate the plateau voltage requires high current in order to keep the slope to go down. The transistor Q1 gate voltage decreasing causes less current to pass through transistor Q1 according to the transfer curve. As the gate voltage comes down, the amount of current that allows passing through transistor Q1 will be less according to the transfer curve. The capacitor C2 determines a width of the second slope region.

A similar operation is illustrated for the second wave-shape circuit 14B including a first subcircuit that includes each, all, or any combination of elements including R11, R15, R16, and C11 reference to AC motor phase and a second subcircuit that includes each, all, or any combination of elements including R12, R13, R14, C12, and C13 reference to AC motor phase.

One key component of the waveshape circuit 14 is the resistors divider (voltage divider) of P-FETs connected to AC motor phase ground of bridge 18. The resistors divider includes resistors R16 and R14 connected to W-Phase GND and IC 12 ground. R6 and R4 connected to W-Phase VS as indicated on FIG. 6. These are the key for three phase AC Drive.

One or more additional circuit elements may define a third subcircuit that is configured to determine a third slope region for the transfer function of the waveshape circuit 14. The third subcircuit includes a second resistor and a third resistor with values that determined the third slope region. A slope of the third slope region is greater than a slope of the second slope region and the slope of the third slope region is greater than a slope of the first slope region.

Figure 8:
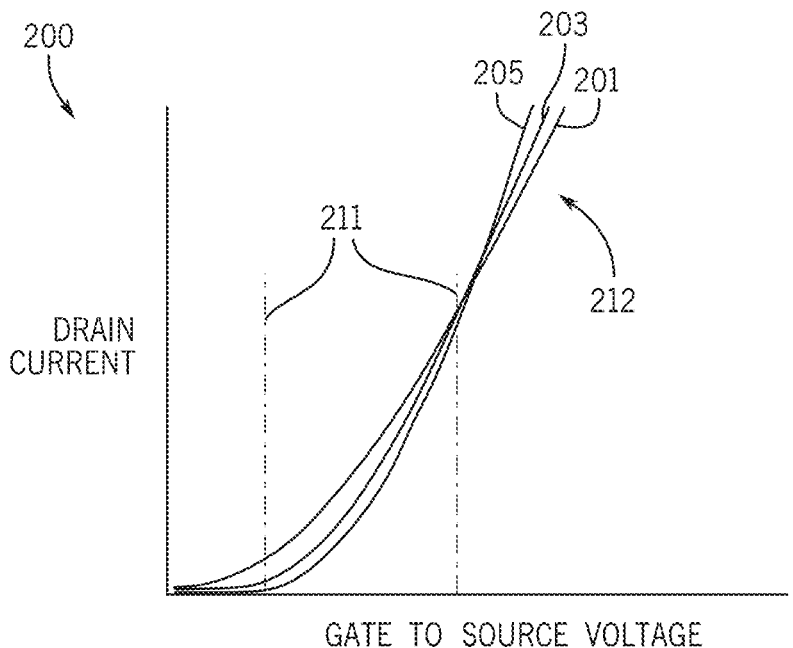
FIG. 8 illustrates the transistor transfer characteristics for one type of transistor in the driving circuit.

FIG. 8 illustrates example transfer characteristics for the transistor Q1 and transistor Q2 with the gate to source voltage on the horizontal axis and the drain current on the vertical axis. FIG. 8 illustrates that the transfer characteristic varies based on temperature. Plot 203 is the transfer char-acteristic at a first temperature (e.g., typical room tempera-ture). Plot 201 is the transfer characteristic at a second temperature (e.g., hot temperature). Plot 205 is the transfer characteristic at a third temperature (e.g., cold temperature). At the intersection of plots 201-205 is the zero temperature coefficient where the same gate to source voltage provides the same drain current at all temperatures.

The transistors Q1 and Q2 of the waveshape circuit 14 may exhibit similar temperature variations as the power MOSFETs of the power bridge 18. Because the waveshape circuit 14 and the power bridge 18 are physically located on the same board or placed near the same heat conducting element (e.g., metal plate), the waveshape circuit 14 and the power bridge 18 are at the same temperature or substantially the same temperature. The term substantially the same temperature may mean with a predetermined amount or such that any variation in output of the transistor based on the temperature change is not impactful. The first transistor Q1 or the second transistor Q2 is at substantially a same temperature as the power circuit 18.

Figure 9:
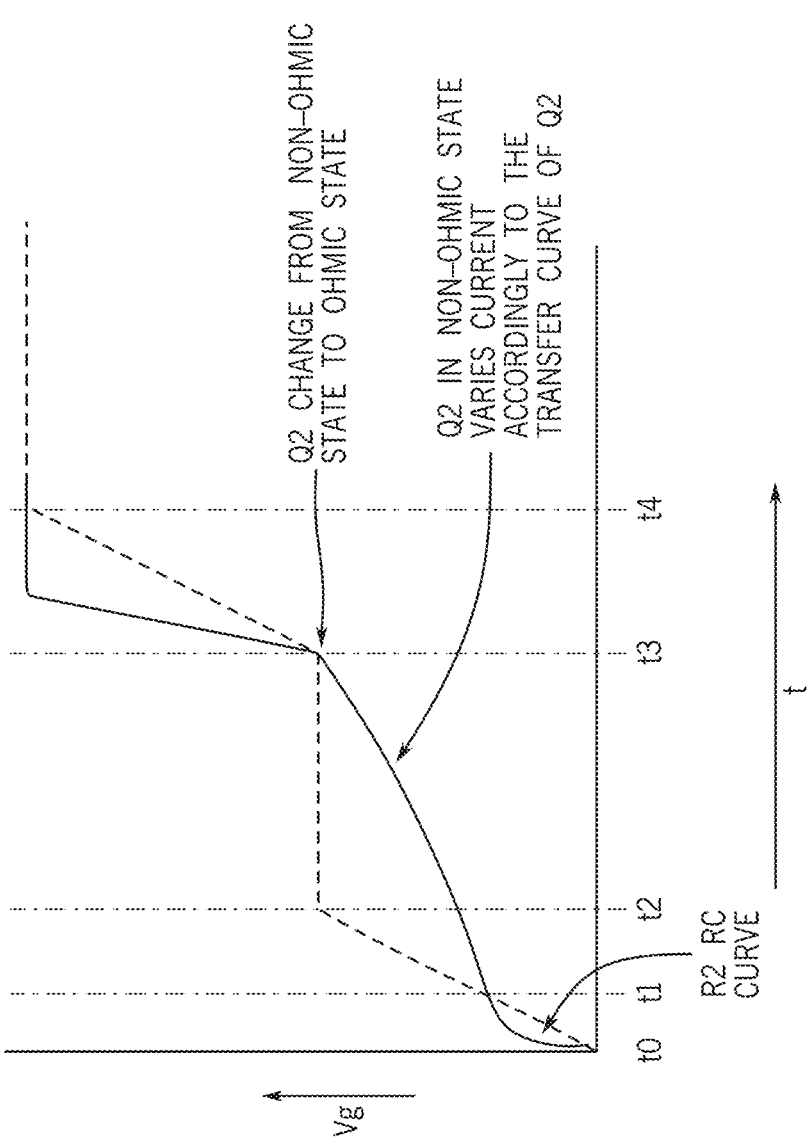
FIG. 9 illustrates an example plural slope sequence for the driving circuit.

FIG. 9 illustrates another time chart for the output of one of the transistors Q1 or Q2 including a plurality of slopes or rates of change for the output of the waveshape circuit 14 that provides the gate voltage for the MOSFETs of the power circuit 18. A MOSFET operates in three regions: a cutoff region, a triode region, and saturation region, which may be defined based on the condition of the inversion layer existing between the source and drain of the MOSFET.

The triode region is the operating region where the inversion region exists and current flows, but this region has begun to taper near the source. The potential requirement here is Vds<Vgs−Vth.

Here, the drain source current has a parabolic relationship with the drain source potential. The MOSFET operates as a switch in this region.

The linear region of a MOSFET can be considered as a special portion of the triode region, where because of the very small value of the applied drain-source potential, there is a roughly linear relationship between Vds and Ids and the MOSFET behaves like a voltage dependent resistor. The potential condition for linear or "deep triode" region is Vds≪Vgs−Vth.

A first slope or first curvature is illustrated between times t0 and t1. A second slope or second curvature is illustrated between times t1 and t3 in non-ohmic state. During the region from times t1 to t3 the gate voltage of either transistor Q1 or Q2 (depending on whether r in the turn off sequence or turn on sequence) run in open loop. A third slope or third curvature is illustrated between times t3 and t4 in ohmic state. Starting at time t3, the transistor Q1 or Q2 (depending on whether r in the turn off sequence or turn on sequence). Tuning on state one to state two at a gradual slope causes less dv/dt feedback at the driver, which needs less current from the driver to drive the gate voltage out of the miller plateau. Therefore, the transition from the triode to satura-tion is a continuous function instead of a step function which is important for less diode recovery current.

Figure 10:
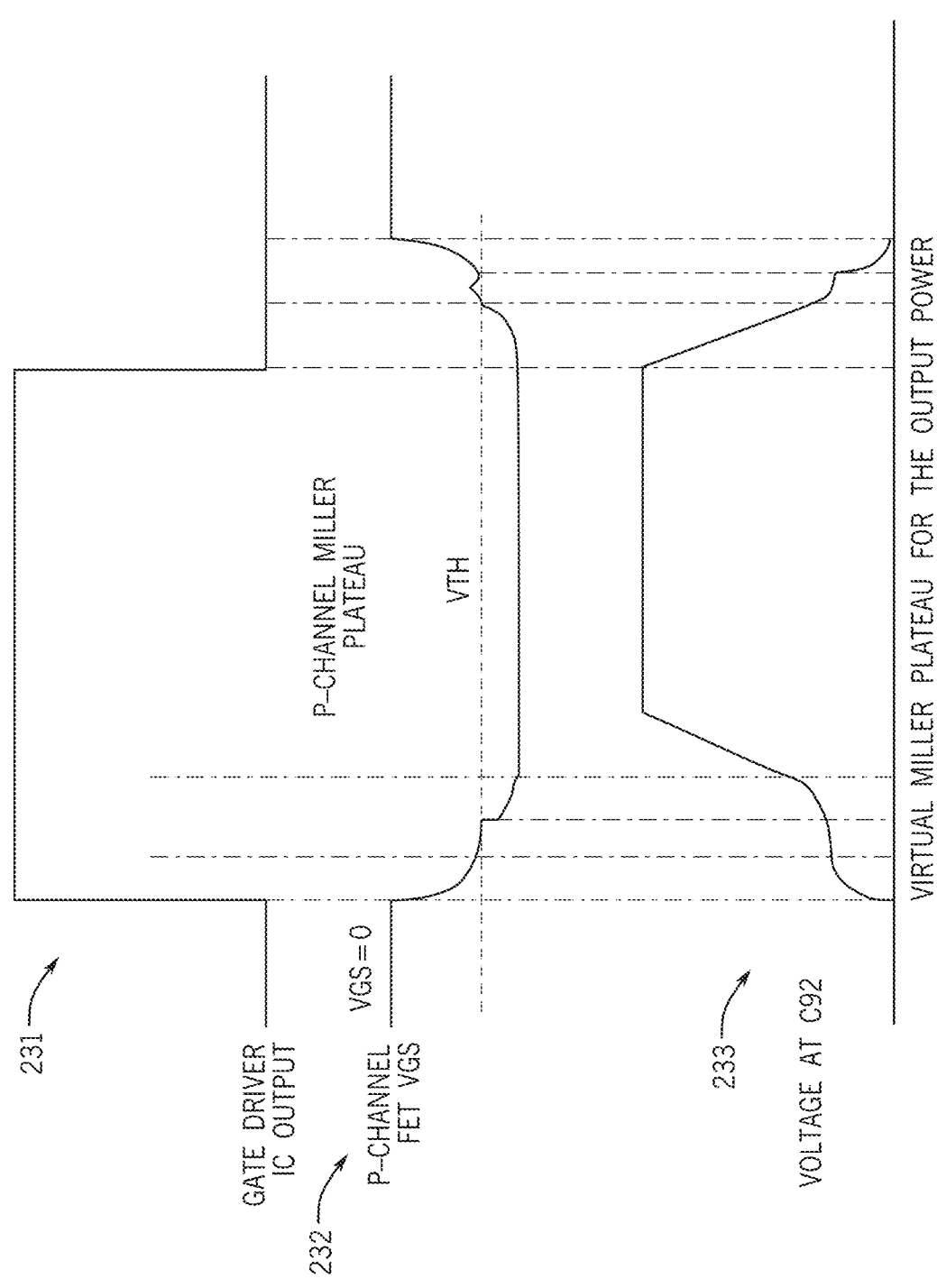
FIG. 10 illustrates a timing chart to illustrate the operation of the system of FIG. 3.

FIG. 10 illustrates a timing chart to illustrate the operation of the system for driving the induction motor 20. Square wave or step function 231 corresponds to the output of the IC driver 12. The gate to source voltage of the waveshape circuit 14 is illustrated by plot 232. The rising edge of the step function 231 starts the turning on sequence of the driving circuit in plot 232. The gate voltage of the MOSFETs of the power bridge 18 is illustrated by plot 233.

Figure 11:
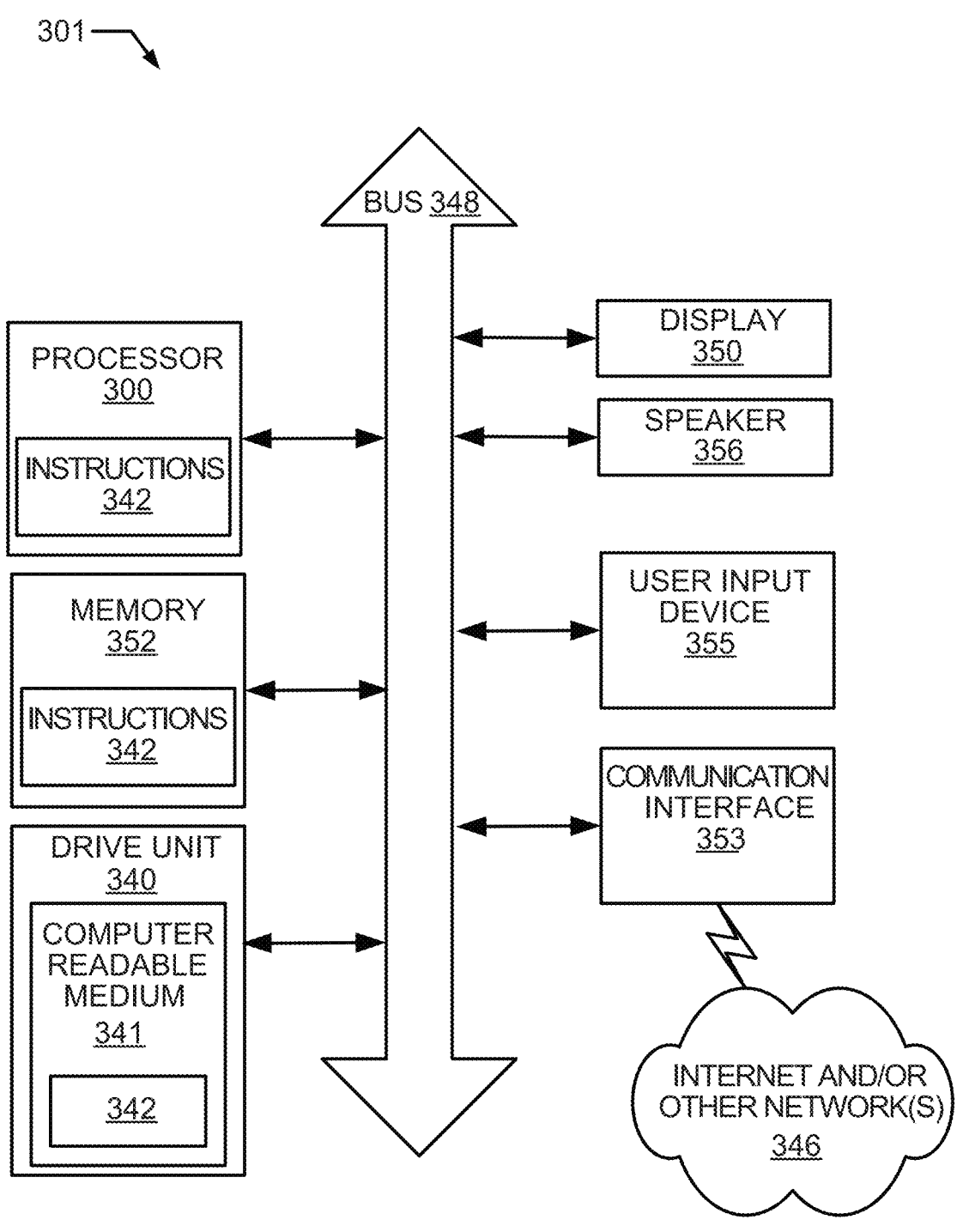
FIG. 11 illustrates an example controller for any of the disclosed embodiments.

FIG. 11 illustrates an example control system or controller 301 for any of the embodiments described herein (e.g., microcontroller 10). The controller 301 may include a processor 300, a memory 352, and a communication inter-face 353 for interfacing with devices or to the internet and/or other networks 346. In addition to the communication inter-face 353, a sensor interface may be configured to receive data from the sensors described herein or data from any source. The components of the control system may commu-nicate using bus 348. The control system may be connected to a workstation or another external device (e.g., control panel) and/or a database for receiving user inputs, system characteristics, and any of the values described herein.

Optionally, the control system may include an input device 355 and/or a sensing circuit 356 in communication with any of the sensors. The sensing circuit receives sensor measurements from sensors as described above. The input device may include any of the user inputs such as buttons, touchscreen, a keyboard, a microphone for voice inputs, a camera for gesture inputs, and/or another mechanism.

Optionally, the control system may include a drive unit 340 for receiving and reading non-transitory computer media 341 having instructions 342. Additional, different, or fewer components may be included. The processor 300 is configured to perform instructions 342 stored in memory 352 for executing the algorithms described herein. A display 350 may be an indicator or other screen output device. The display 350 may be combined with the user input device 355.

Processor 300 may be a general purpose or specific purpose processor, an application specific integrated circuit (ASIC), one or more programmable logic controllers (PLCs), one or more field programmable gate arrays (FPGAs), a group of processing components, or other suitable processing components. Processor 300 is configured to execute computer code or instructions stored in memory 352 or received from other computer readable media (e.g., embedded flash memory, local hard disk storage, local ROM, network storage, a remote server, etc.). The processor 300 may be a single device or combinations of devices, such as associated with a network, distributed processing, or cloud computing.

Memory 352 may include one or more devices (e.g., memory units, memory devices, storage devices, etc.) for storing data and/or computer code for completing and/or facilitating the various processes described in the present disclosure. Memory 352 may include random access memory (RAM), read-only memory (ROM), hard drive storage, temporary storage, non-volatile memory, flash memory, optical memory, or any other suitable memory for storing software objects and/or computer instructions. Memory 352 may include database components, object code components, script components, or any other type of information structure for supporting the various activities and information structures described in the present disclosure. Memory 352 may be communicably connected to processor 300 via a processing circuit and may include computer code for executing (e.g., by processor 300) one or more processes described herein. For example, the memory 352 may include graphics, web pages, HTML files, XML files, script code, shower configuration files, or other resources for use in generating graphical user interfaces for display and/or for use in interpreting user interface inputs to make command, control, or communication decisions.

In addition to ingress ports and egress ports, the communication interface 353 may include any operable connection. An operable connection may be one in which signals, physical communications, and/or logical communications may be sent and/or received. An operable connection may include a physical interface, an electrical interface, and/or a data interface. The communication interface 353 may be connected to a network. The network may include wired networks (e.g., Ethernet), wireless networks, or combinations thereof. The wireless network may be a cellular telephone network, an 802.11, 802.16, 802.20, or WiMax network, a Bluetooth pairing of devices, or a Bluetooth mesh network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 352) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

What is claimed is:

1. A gate drive circuit for power circuit of a motor, the gate drive circuit comprising:
   an input configured to receive a current;
   an output configured to couple to a gate terminal of a power transistor;
   a first transistor configured to, during turn on, substantially pass the current through the gate drive circuit to the output and block the current, during turn off, for a transition of a power circuit of the motor;
   a second transistor configured to, during turn on, substantially block the current through the gate drive circuit and substantially pass current to the output, during turn off, for the transition for the power circuit of the motor according to a transfer function;
   a first subcircuit coupled to the first transistor and configured to determine a first slope region of the transfer function for the gate drive circuit; and
   a second subcircuit coupled to the second transistor and configured to determine a second slope region of the transfer function for the gate drive circuit, wherein the second subcircuit includes a capacitor that determines a width of the second slope region.

2. The gate drive circuit of claim 1, wherein the first subcircuit includes a first resistor and a second capacitor with values that determine the first slope region.

3. The gate drive circuit of claim 1, wherein an emitter follower circuit coupled to the power circuit of the motor amplifies an output of the gate drive circuit.

4. The gate drive circuit of claim 1, further comprising:
   a third subcircuit configured to determine a third slope region for the transfer function of the gate drive circuit.

5. The gate drive circuit of claim 4, wherein the third subcircuit includes a second resistor and a third resistor with values that determined the third slope region.

6. The gate drive circuit of claim 4, wherein a slope of the third slope region is greater than a slope of the second slope region and the slope of the third slope region is greater than a slope of the first slope region.

7. The gate drive circuit of claim 1, wherein the first slope region has a slope that is different from a slope of the second slope region.

8. The gate drive circuit of claim 1, wherein the first transistor and the second transistors are P-type metal oxide semiconductor field effect transistors (MOSFETS).

9. The gate drive circuit of claim 1, wherein the power circuit includes at least one half-bridge inverter.

10. The gate drive circuit of claim 9, wherein the power circuit includes three half-bridge inverters at each of the three half-bridge inverters includes a plurality of power MOSFETS.

11. The gate drive circuit of claim 9, wherein the first transistor or the second transistor is at substantially a same temperature as the power circuit for temperature compensation.

12. A method for driving a power circuit of a motor, the method comprising:
   receiving an input signal, wherein the input signal indicates a transition for a power circuit of the motor;
   blocking current at a first transistor of a gate driver for the transition from ON to OFF for the power circuit of the motor according to a transfer function, wherein the transfer function includes: a first slope region determined by a first subcircuit transfer curve and a second slope region determined by a second subcircuit transfer curve; and
   passing current at a second transistor through the gate driver to a gate terminal of a power transistor during the transition from on to off for the power circuit of the motor.

13. The method of claim 12, wherein the transition for the power circuit of the motor is a turn ON transition and the transition for the power circuit of the motor is a turn OFF transition, the method further comprising:
   during turn ON, blocking current at the second transistor of the gate driver; and
   passing current at the first transistor through the gate driver according to a second transistor transfer function, wherein the second transfer function includes:
   a first slope region determined by a third subcircuit coupled to the second transistor; and
   a second slope region determined by a fourth subcircuit coupled to the second transistor.

14. A gate drive circuit for a motor, the gate drive circuit comprising:
   an input configured to receive a current;
   an output configured to couple to a gate terminal of a power transistor;
   a plurality of transistors configured to selectively pass and block the current for a transition of a power circuit of the motor according to a transfer function;
   a first subcircuit coupled to the at least one of the plurality of transistors and configured to determine a first slope region of the transfer function for the gate drive circuit; and
   a second subcircuit coupled to at least one of the plurality of transistors and configured to determine a second slope region of the transfer function for the gate drive circuit, wherein the second subcircuit includes a capacitor that determines a width of the second slope region.

15. The gate drive circuit of claim 14, wherein the first subcircuit includes a first resistor and a second capacitor with values that determine the first slope region.

16. The gate drive circuit of claim 14, wherein an emitter follower circuit coupled to the power circuit of the motor amplifies an output of the v circuit.

17. The gate drive circuit of claim 14, further comprising:
   a third subcircuit configured to determine a third slope region for the transfer function of the gate drive circuit.

18. The gate drive circuit of claim 17, wherein the third subcircuit includes a second resistor and a third resistor with values that determined the third slope region.

19. The gate drive circuit of claim 17, wherein a slope of the third slope region is greater than a slope of the second slope region and the slope of the third slope region is greater than a slope of the first slope region.

20. The gate drive circuit of claim 14, wherein the first slope region has a slope that is different from a slope of the second slope region.

* * * * *